United States Patent
Lau

(10) Patent No.: US 6,429,088 B1
(45) Date of Patent: Aug. 6, 2002

(54) METHOD OF FABRICATING IMPROVED CAPACITORS WITH PINHOLE REPAIR CONSIDERATION WHEN OXIDE CONDUCTORS ARE USED

(75) Inventor: Wai Shing Lau, Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 09/467,137

(22) Filed: Dec. 20, 1999

(51) Int. Cl.[7] .................. H01L 21/00; H01L 21/20; H01L 21/324; H01L 21/322
(52) U.S. Cl. .................. 438/393; 438/3; 438/240
(58) Field of Search ................ 438/240, 396, 438/398, 253, 250, 393, 3

(56) References Cited

U.S. PATENT DOCUMENTS

| | | | |
|---|---|---|---|
| 4,495,219 A | * | 1/1985 | Kate et al. ............... 427/82 |
| 4,937,650 A | * | 6/1990 | Shinriki ............... 357/51 |
| 5,003,428 A | * | 3/1991 | Shepard ............... 361/321 |
| 5,079,191 A | * | 1/1992 | Shinriki ............... 437/235 |
| 5,324,679 A | * | 6/1994 | Kim et al. | 
| 5,336,638 A | * | 8/1994 | Suzuki et al. |
| 5,569,619 A | * | 10/1996 | Roh |
| 5,729,424 A | * | 3/1998 | Sharp ............... 361/273 |
| 5,731,235 A | * | 3/1998 | Srinivasan et al. ....... 438/253 |
| 5,807,774 A | * | 9/1998 | Desu ............... 438/240 |
| 5,861,332 A | * | 1/1999 | Yu ............... 438/240 |
| 5,877,062 A | * | 3/1999 | Horii ............... 438/396 |
| 6,111,744 A | * | 8/2000 | Doan ............... 361/311 |
| 6,251,720 B1 | * | 6/2001 | Thakur et al. ............ 438/240 |

FOREIGN PATENT DOCUMENTS

| | | | | |
|---|---|---|---|---|
| JP | 62-234360 | * | 10/1987 | ........ H01L/27/04 |
| JP | 7-221201 | * | 8/1995 | ...... H01L/21/8242 |

OTHER PUBLICATIONS

Yamamichi et al., "A stacked capacitor technology with ECR plasma MOCVD (Ba, Sr)TiO$_3$ and RuO$_2$/Ru/TiN/TiSix storage nodes for Gb-scale DRAM's", IEEE Trans. Electron. Dev., vol. 44, pp. 1076–1083.

* cited by examiner

Primary Examiner—Mary Wilczewski
(74) Attorney, Agent, or Firm—George O. Saile; Rosemary L.S. Pike; Stephen G. Stanton

(57) ABSTRACT

A method of fabricating a metal-oxide-metal (MOM) capacitor, comprising the following steps. A bottom metal layer is deposited. A high dielectric constant oxide insulator is deposited layer over the bottom metal layer. The structure is annealed in an oxidizing ambient to cause the exposed bottom metal to form a metal oxide partially filling the one or more pin hole defects to repair those pin hole defects. An upper oxide conductor layer is then deposited over the high dielectric constant oxide insulator layer. An upper metal layer is deposited over said upper oxide conductor layer.

15 Claims, 2 Drawing Sheets

METHOD OF FABRICATING IMPROVED CAPACITORS WITH PINHOLE REPAIR CONSIDERATION WHEN OXIDE CONDUCTORS ARE USED

FIELD OF THE INVENTION

The present invention relates generally to methods of forming capacitors, and specially to fabricating improved MOM and MOS capacitors with pinhole repair consideration when oxide conductors are used as part of the bottom or top electrode.

BACKGROUND OF THE INVENTION

Metal-oxide-metal (MOM) (also known as metal-insulator-metal (MIM)) or metal oxide semicondutor (MOS) capacitors involving high dielectric constant (K) oxide insulators, such as $Ta_2O_5$, are becoming more and more important in microelectronics. High-K oxide insulator MOM, or MIM, capacitors are used for memory in DRAM or as RF capacitors in mixed signal IC (integrated circuits). High-K MOS capacitors can form part of MOSFET devices.

When an oxide material insulator is deposited onto a metal/semiconductor layer or when a metal is deposited onto an oxide insulator, the metal/semiconductor layer tends to react with the oxide through a reduction reaction. This is especially true of the bottom metal electrode of a MOM capacitor, for example. This creates oxygen vacancies in the oxide insulator resulting in leakage current. This generation of oxygen vacancies by the reaction between the oxide insulator and the metal/semiconductor layer electrode also happens during annealing of the oxide insulator in an oxidizing ambient after the deposition of the oxide insulator. This limits the effect of the annealing in the reduction of oxygen vacancies and so leakage current. Other degradation of the electrical properties of the oxide insulator is also possible such as a reduced capacitance because of the formation of another insulating metal oxide film (or an oxide of semiconductor layer) of the metal/semiconductor layer electrode during the deposition of the oxide insulator or during the post-deposition annealing in an oxidizing ambient.

In an article entitled "A stacked capacitor technology with ECR plasma MOCVD $(Ba,Sr)TiO_3$ and $RuO2/Ru/TiN/TiSix$ storage nodes for Gb-scale DRAM's," IEEE Trans. Electron. Dev., vol. 44, pp. 1076–1083, Yamamichi et al. used $RuO_2/Ru$ as a conducting oxide between $(Ba,Sr)TiO_3$ (high-K oxide insulator) and $TiN/TiSix/n^+$-poly (bottom electrode) in their capacitors.

U.S. Pat. No. 5,861,332 to Yu et al. describes a method of fabricating a capacitor of a semiconductor device which is capable of improving the chemical and thermal stability of lower electrodes. The chemical and thermal stability of the lower electrode is accomplished by forming a SrO film over a ruthenium dioxide ($RuO_2$) film over a patterned ruthenium film, whereby the SrO and $RuO_2$ react to form a $SrRuO_2$ film interface during a high temperature deposition of a high dielectric film over the structure.

U.S. Pat. No. 5,877,062 to Horii describes a method of forming an integrated circuit capacitor having a protected diffusion barrier metal layer therein. The diffusion barrier metal layer inhibits parasitic migration of silicon from the polysilicon plug to the first electrically conductive layer. The capacitor dielectric layer is selected from the group $Ta_2O_5$, $SrTiO_3$, $BaTiO_3$, $(Ba,Sr)TiO_3$, $Pb(Zr,Ti)O_3$, $SrBi_2Ta_2O_9$ (SBT), $(Pb, La)(Zr, Ti)O_3$ and $Bi_4Ti_3O_{12}$, etc.

SUMMARY OF THE INVENTION

Accordingly, it is an object of the present invention to provide a method of fabricating improved MOM and MOS capacitors by the use of a conductive metal oxide film between the oxide insulator and the top metal only.

Another object of the present invention is to provide a method of fabricating improved MOM capacitors by the use of a conductive metal oxide film between the oxide insulator and the bottom metal with or without the use of a conductive metal oxide film between the oxide insulator and the top metal.

Yet another object of the present invention is to provide a method of repairing pinholes in an oxide insulator layer when a conductive metal oxide film is inserted between the oxide insulator layer and the bottom metal layer.

Other objects will appear hereinafter.

It has now been discovered that the above and other objects of the present invention may be accomplished in the following manner. Specifically, a bottom metal layer is deposited. A high dielectric constant oxide insulator is deposited layer over the bottom metal layer. The structure is annealed in an oxidizing ambient to cause the exposed bottom metal to form a metal oxide partially filling the one or more pin hole defects to repair those pin hole defects. An upper oxide conductor layer is then deposited over the high dielectric constant oxide insulator layer. An upper metal layer is deposited over said upper oxide conductor layer.

BRIEF DESCRIPTION OF THE DRAWINGS

The features and advantages of an improved capacitor and the method of fabricating the same according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

The previous approaches ignore an important consideration which is pinhole defect formation in the oxide insulator. It is important that the pinholes be repaired, especially for large area capacitors. This is usually done by an anneal in an oxidizing ambient after the oxide insulator deposition on metal or a semiconductor layer, which can form insulating oxide films. If there are any pinholes, the exposed bottom metal/semiconductor layer will be oxidized, resulting in repair of pinholes by this, essentially, self-repair mechanism. (This annealing can also reduce oxygen vacancies or other defects and quite frequently reduce leakage current.)

Pinhole repair is thus important for high yield of MOM/MOS capacitors. If there is a layer of conducting oxide, this self-repair mechanism is not available. In this invention, the focus is on how to apply conductive oxide between an oxide insulator and metal to form a capacitor with pinhole repair considerations.

Figure 1:
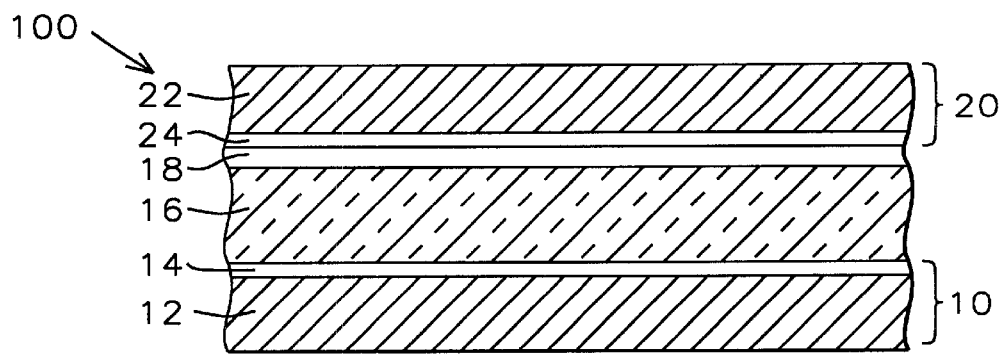
FIGS. 1 through 3 schematically illustrate in cross-sectional representation three alternate embodiments, respectively, of the present invention.
Figure 2:
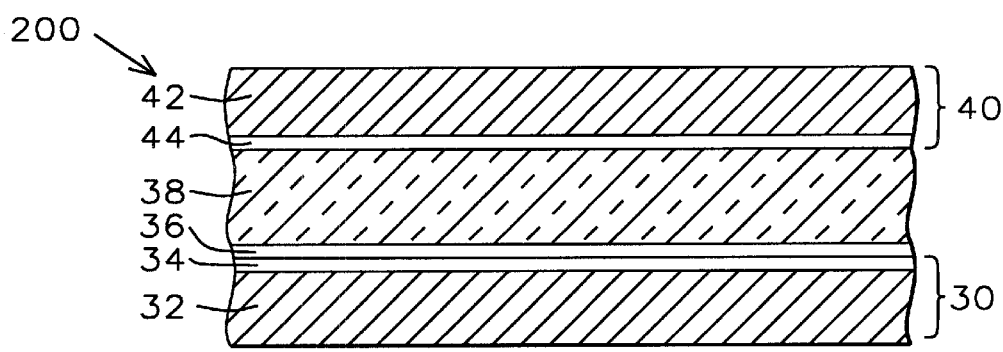
Figure 3:
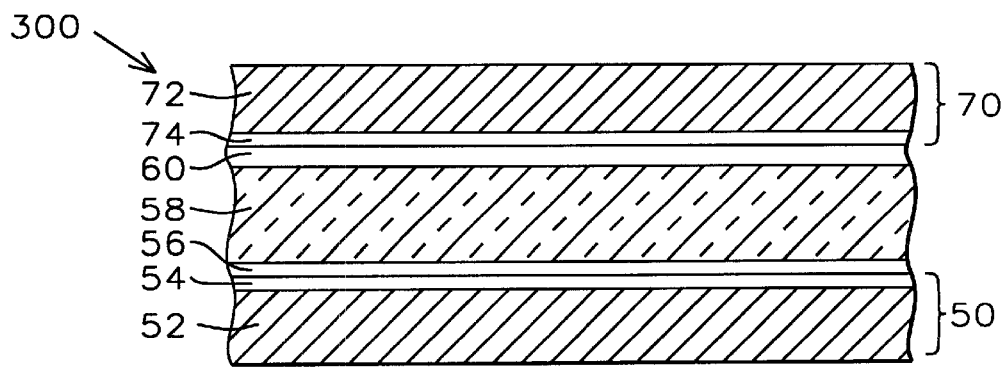

Accordingly as shown in FIGS. 1–3, are three respective embodiments of the present invention. The gist of the invention is that at least one oxide conductor layer, e.g. indium tin oxide ($In_2O_3$:Sn), tin oxide ($SnO_2$), zinc oxide (ZnO), ruthenium oxide ($RuO_2$), etc., is formed under and/or over a high-K oxide insulator layer in a MOM or MOS capacitor. The high-K oxide insulator layer may be selected from the group $Ta_2O_5$, $SrTiO_3$, $BaTiO_3$, $(Ba,Sr)TiO_3$, $Pb(Zr,Ti)O_3$, $SrBi_2Ta_2O_9$ (SBT), $(Pb, La)(Zr, Ti)O_3$ and $Bi_4Ti_3O_{12}$, etc.

If an oxide conductor layer is formed under the high-K oxide insulator layer, it is formed as a very thin layer to facilitate pin hole repair of the high-K oxide insulator layer as will be discussed below. The metal layers may comprise a metal layer, preferably Al, with a barrier metal, preferably TiN or TiN/Ti, adjacent the middle high-K oxide insulator layer.

First Embodiment

As shown in FIG. 1, in the first embodiment of the present invention, only an upper oxide conductor layer 18 is used in the formation of MOM capacitor 100.

Bottom metal layer 10 is deposited. Bottom metal layer 10, having a thickness of from about 1000 to 4000 Å, may comprise lower Al layer 12, having a thickness of from about 1000 to 4000 Å, covered by lower barrier metal layer 14, which preferably TiN or TiN/Ti, etc., having a thickness of from about 100 to 400 Å.

High-K oxide insulator layer 16 is deposited over metal layer 14. High-K oxide insulator layer 16 may be selected from the group $Ta_2O_5$, $SrTiO_3$, $BaTiO_3$, $(Ba,Sr)TiO_3$, $Pb(Zr,Ti)O_3$, $SrBi_2Ta_2O_9$ (SBT), $(Pb, La)(Zr, Ti)O_3$ and $Bi_4Ti_3O_{12}$, etc. High-K oxide insulator layer 16 has a thickness of from about 50 to 500 Å.

The structure is then annealed in an oxidizing ambient to repair oxygen vacancies or other defects and also to repair any pinholes (not shown in FIG. 1) in high-K oxide insulator layer 16. During the anneal, any pinhole exposed bottom metal layer 10 would oxidize and partially fill and insulate the pinhole defect, thus repairing any such pinhole.

Upper oxide conductor layer 18, which may be selected from the group of oxide conductors such as indium tin oxide ($In_2O_3$:Sn), tin oxide ($SnO_2$), zinc oxide (ZnO), ruthenium oxide ($RuO_2$), etc., is then deposited over annealed high-K oxide insulator layer 16. Upper oxide conductor layer 18 has a thickness of from about 100 to 400 Å. Upper oxide conductor layer 18 suppresses the oxygen vacancies that would otherwise be generated by the reaction between adjacent oxide insulator layer 16 and upper metal layer 20 by separating oxide insulator layer 16 and upper metal layer 20.

Upper metal layer 20 is then deposited over upper oxide conductor layer 18 to form MOM capacitor 100. Upper metal layer 20 has a thickness from about 1000 to 4000 Å and may comprise upper barrier metal layer 24, which preferably TiN or TiN/Ti, etc., having a thickness from about 100 to 400 Å, adjacent high-K oxide insulator layer 16 and upper main metal layer 22, which preferably Al having a thickness from about 1000 to 4000 Å, overlying upper barrier metal layer 24.

The first embodiment capacitor of FIG. 1 may be used as a MOM/MIM capacitor or MOS capacitor. For a MOS capacitor using a high-K oxide insulator layer as part of a MOSFET structure, only an upper oxide conductor layer would be used and not a lower oxide conductor layer separating the high-K oxide insulator layer and the semiconductor layer (versus the bottom metal layer 10 of a MOM/MIM capacitor 100) as the conductive oxide would short the source/drain of a MOSFET device. The semiconductor layer may be comprised of polysilicon, doped polysilicon, and a polycide.

Second Embodiment

As shown in FIG. 2, in the second embodiment of the present invention, only a very thin lower oxide conductor layer 36 is used in the formation of MOM capacitor 200.

Bottom metal layer 30 is deposited. Bottom metal layer 30, has a thickness from about 1000 to 4000 Å, and may comprise lower main metal layer 32 which preferably Al, having a thickness from about 1000 to 4000 Å, covered by lower barrier metal layer 34, which preferably TiN or TiN/Ti, etc., having a thickness from about 100 to 400 Å.

Very thin lower oxide conductor layer 36, which may be selected from the group of oxide conductors such as indium tin oxide ($In_2O_3$:Sn), tin oxide ($SnO_2$), zinc oxide (ZnO), ruthenium oxide ($RuO_2$), etc., is deposited over bottom metal layer 30. Lower oxide conductor layer 36 has a thickness of below about 100 Å.

High-K oxide insulator layer 38 is deposited over lower oxide conductor layer 36. High-K oxide insulator layer 38 may be selected from the group $Ta_2O_5$, $SrTiO_3$, $BaTiO_3$, $(Ba,Sr)TiO_3$, $Pb(Zr,Ti)O_3$, $SrBi_2Ta_2O_9$ (SBT), $(Pb, La)(Zr, Ti)O_3$ and $Bi_4Ti_3O_{12}$, etc. High-K oxide insulator layer 38 has a thickness of from about 50 to 500 Å. Lower oxide conductor layer 36 suppresses the oxygen vacancies that would otherwise be generated by the reaction between adjacent oxide insulator layer 38 and bottom metal layer 30 by separating oxide insulator layer 38 and bottom metal layer 30.

Figure 4:
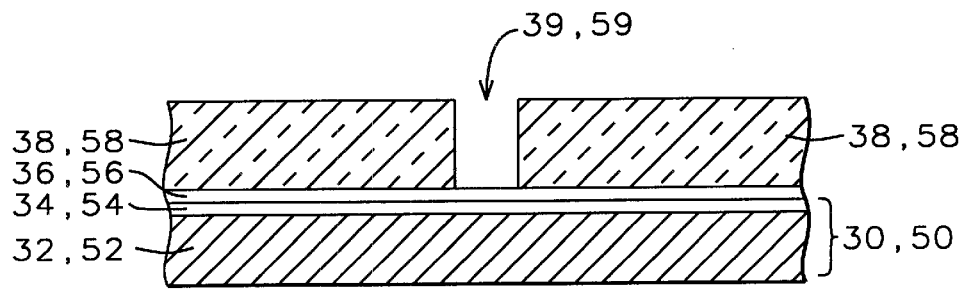
FIGS. 4 through 6 are enlarged, schematic sequential illustrations of intermediate fabrication steps in the second and third embodiment formation of a capacitor having at least a lower oxide conductor layer.

As shown in FIG. 4 (also common to the third embodiment discussed below), insulator layer 38 may have pinhole defects 39 there through that expose underlying lower oxide conductor layer 36. Because lower oxide conductor layer 36 overlies bottom metal layer 30, simply annealing insulator layer 38 in an oxidizing ambient to oxidize bottom metal layer 30, as was done in the first embodiment, would not repair any pinholes 39.

Figure 5:
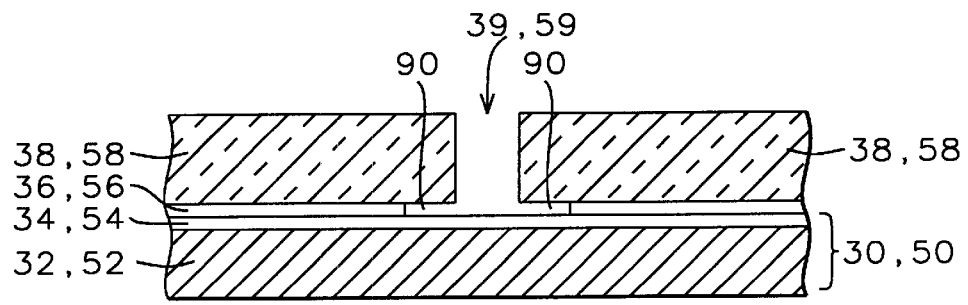
Figure 6:
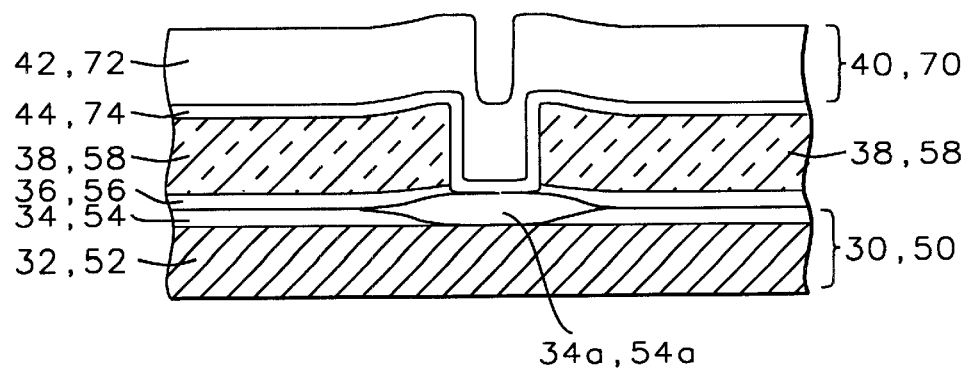

Briefly, any pinhole(s) 39 is repaired by: etching the exposed lower oxide conductor layer 36 below pinhole(s) 39 to expose underlying bottom metal layer 30; followed by annealing in an oxidizing ambient to oxidize the exposed underlying bottom metal layer 30 as shown in FIGS. 5 and 6 and as will be discussed in greater detail below.

As shown in FIG. 2, after the repair of any pinhole(s) 39 in high-K oxide insulator layer 38, upper metal layer 40 is then deposited over pinhole repaired high-K oxide insulator layer 38 to form MOM capacitor 200.

Upper metal layer 40 is then deposited over high-K oxide insulator layer 38 to form MOM capacitor 200. Upper metal layer 40 has a thickness from about 1000 to 4000 Å and may comprise upper barrier metal layer 44, which is preferably TiN or TiN/Ti, etc., having a thickness from about 100 to 400 Å, adjacent high-K oxide insulator layer 38 and upper main metal layer 42, which preferably Al having a thickness from about 1000 to 4000 Å, overlying upper barrier metal layer 44.

Third Embodiment

As shown in FIG. 3 in the third, and preferred, embodiment for MOM capacitors of the present invention, a very thin lower oxide conductor layer 56 and an upper oxide conductor layer 60 are used in the formation of MOM capacitor 300.

Bottom metal layer 50 is deposited. Bottom metal layer 50, having a thickness from about 1000 to 4000 Å, may comprise lower Al layer 52, having a thickness from about 1000 to 4000 Å, covered by lower barrier metal layer 54, which preferably TiN or TiN/Ti, etc., having a thickness from about 100 to 400 Å.

Very thin lower oxide conductor layer 56, which may be selected from the group of oxide conductors such as indium tin oxide (In$_2$O$_3$:Sn), tin oxide (SnO$_2$), zinc oxide (ZnO), ruthenium oxide (RuO$_2$), etc., is deposited over bottom metal layer 50. Lower oxide conductor layer 56 has a thickness of below about 100 Å.

High-K oxide insulator layer 58 is deposited over lower oxide conductor layer 56. High-K oxide insulator layer 58 may be selected from the group Ta$_2$O$_5$, SrTiO$_3$, BaTiO$_3$, (Ba,Sr)TiO$_3$, Pb(Zr,Ti)O$_3$, SrBi$_2$Ta$_2$O$_9$ (SBT), (Pb, La)(Zr, Ti)O$_3$ and Bi$_4$Ti$_3$O$_{12}$, etc. High-K oxide insulator layer 58 has a thickness of from about 50 to 500 Å. Lower oxide conductor layer 56 suppresses the oxygen vacancies that would otherwise be generated by the reaction between adjacent oxide insulator layer 58 and bottom metal layer 50 by separating oxide insulator layer 58 and bottom metal layer 50.

As shown in FIG. 4 (also common to the second embodiment discussed above), insulator layer 58 may have pinhole defects 59 there through that expose underlying lower oxide conductor layer 56. Because lower oxide conductor layer 56 overlies bottom metal layer 50, simply annealing insulator layer 58 to oxidize bottom metal layer 50, as was done in the first embodiment, would not repair any pinholes 59.

Briefly, any such pinhole(s) 59 are repaired by: etching the exposed lower oxide conductor layer 56 below pinhole (s) 59 to expose underlying bottom metal layer 50; followed by annealing in an oxidizing ambient to oxidize the exposed underlying bottom metal layer 50 as shown in FIGS. 5 and 6 and as will be discussed in greater detail below.

As shown in FIG. 3, after the repair of any pinholes 59 in high-K oxide insulator layer 58, upper oxide conductor layer 60, which may be selected from the group of oxide conductors such as indium tin oxide (In$_2$O$_3$:Sn), tin oxide (SnO$_2$), zinc oxide (ZnO), ruthenium oxide (RuO$_2$), etc., is then deposited over pinhole repaired insulator layer 58. Upper oxide conductor layer 60 has a thickness from about 100 to 400 Å. Upper oxide conductor layer 60 suppresses the oxygen vacancies that would otherwise be generated by the reaction between adjacent oxide insulator layer 58 and upper metal layer 70 by separating oxide insulator layer 58 and upper metal layer 70.

Upper metal layer 70 is then deposited over upper oxide conductor layer 60 to form MOM capacitor 300. Upper metal layer 70 may comprise upper main metal layer 72, which preferably Al, over upper barrier metal layer 74, which preferably TiN, adjacent upper oxide conductor layer 60. Upper metal layer 70 has a thickness from about 1000 to 4000 Å, upper main metal layer 72 has a thickness from about 1000 to 4000 Å, and upper barrier metal layer 74 has a thickness from about 100 to 400 Å.

Repair of Pinholes in Lower Oxide Conductor Layer Capacitors

FIG. 4 is an enlarged illustration of a sample pinhole defect 39, 59 of the second and third embodiments, respectively, of the present invention which include very thin lower oxide conductor layer 36, 56, separating high-K oxide insulator layer 38, 58, from bottom metal layers 30, 50, respectively.

To avoid the deleterious effects of pinholes 39, 59, pinholes 39, 59 must be repaired. However, because lower oxide conductor layer 36, 56 masks bottom metal layer 30, 50 annealing of high-K oxide insulator layer 38, 58 will not allow repair of pinhole defects 39, 59 as is done in the first embodiment that has only upper oxide conductor layer 18.

One way to avoid this difficulty is, of course, to just fabricate the capacitor of the first embodiment, that is using an upper oxide conductor layer 18 to separate upper metal layer 20 from high-K oxide insulator layer 16 without any lower oxide conductor layer to separate high-K oxide insulator layer 16 from bottom metal layer 10.

This is acceptable for that design and necessary for MOS capacitors where any lower oxide conductor layer separating the high-K oxide insulator layer from the semiconductor layer would short the semiconductor source/drain. However this will not suffice for the second embodiment and the third, preferred, embodiment of the present invention.

To solve this pinhole 39, 59 repair problem of the second embodiment and the preferred third embodiment, the inventors have discovered the following method illustrated in FIGS. 4–6.

As shown in FIG. 4, a very thin lower conductor layer 36, 56 is used to separate high-K oxide insulator layer 38, 58 from bottom metal layer 30, 50. The very thin conductor layer 36, 56 has a thickness below about 100 Å.

Deposition of high-K oxide insulator layer 38, 58 over lower conductor layer 36, 56 may result in the formation of number of pinholes through insulator layer 38, 58, such as pinhole 39, 59. Pinhole 39, 59 exposes a portion of underlying conductor layer 36, 56.

As shown in FIG. 5, a selective etch (or non-selective etch sacrificing part of the high-K oxide insulator 38, 58) is then performed to remove the exposed conductor layer 36, 56 under any formed pinholes 38, 58. The selective/non-selective etch of exposed underlying conductor layer 36, 56 may be wet or dry etch, or a vapor phase etch.

For example in the preferred In$_2$O$_3$:Sn oxide conductor layer 36, 56, Ta$_2$O$_5$ high-K oxide insulator layer 38, 58, and bottom metal layer 30, 50 comprised of lower Al layer 32, 52 covered by lower TiN/Ti layer 34, 54 adjacent Ta$_2$O$_5$ high-K oxide insulator layer 38, 58, a highly selective etch is available. The high-K oxide insulator layer comprised of Ta$_2$O$_5$ is very chemically stable and requires a strong acid such as HF in order to etch it. However, the indium tin oxide conductor layer 36, 56 may be easily etched by HCl. Thus a selective wet/vapor phase HCl etch is used to selectively etch indium tin oxide relative to Ta$_2$O$_5$ as shown in FIG. 5.

In the event that the etch to be used does not have good selectivity, it is possible to compensate by depositing a slightly thicker high-K oxide insulator layer 38, 58 and then use that relatively non-selective etch to remove the exposed portion of underlying conductor layer 36, 56.

As shown in FIG. 5, some over-etch should be allowed so that some undercutting of the conductor layer 36, 56 is produced, as shown at 90. The etch/over-etch of exposed conductor layer 36, 56 under pinhole 39, 59 uncovers and exposes a portion of underlying metal layer 30, 50 as shown at 90.

As shown in FIG. 6, a subsequent anneal in an oxidizing ambient causes enough of the exposed bottom metal layer 30, 50, for example lower TiN/Ti layer 34, 54, to form enough oxide, e.g. TiON, at 34a, 54a to partial fill, and thereby repair pinhole 39, 59 by the insulating effect of oxidized metal layer 34a, 54a.

MOM capacitor 200, 300 may then be completed as detailed above in the second and third embodiments, respectively. Summarizing, for the MOM capacitor 200 of the second embodiment (FIG. 2), upper metal layer 40 is deposited over annealed, pinhole 39 repaired, high-K oxide insulator layer 38 to form MOM capacitor 200. For the MOM capacitor 300 of the third embodiment (FIG. 3), upper oxide conductor layer 60 (not shown in FIG. 6) is deposited over annealed, pinhole 59 repaired, high-K oxide insulator layer 58. Upper metal layer 70 is then deposited over upper oxide conductor layer 60 to form MOM capacitor 300.

While particular embodiments of the present invention have been illustrated and described, it is not intended to limit the invention, except as defined by the following claims.

I claim:

1. A method of fabricating a metal-oxide-metal (MOM) capacitor, comprising the steps of:
   depositing a bottom metal layer;
   depositing a high dielectric constant oxide insulator layer over said bottom metal layer; said high dielectric constant oxide insulator layer having one or more pin hole defects; wherein said high dielectric constant oxide insulator layer is comprised of a material selected from the group comprising $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9(SBT)$, $(Pb, La)(Zr, Ti)O_3$, and $Bi_4Ti_3O_{12}$;
   annealing said structure in an oxidizing ambient to cause said exposed bottom metal to form a metal oxide partially filling said one or more pin hole defects to repair said pin hole defects;
   depositing an upper oxide conductor layer over said high dielectric constant oxide insulator layer; said upper oxide conductor layer is comprised of a material selected from the group comprising indium tin oxide ($In_2O_3$:Sn), tin oxide ($SnO_2$), zinc oxide (ZnO), and ruthenium oxide ($RuO_2$); and
   depositing an upper metal layer over said upper oxide conductor layer; said upper metal layer comprises an upper Al layer over an upper TiN layer, and said bottom metal layer comprises a lower barrier metal layer over a lower Al layer; wherein said bottom metal layer includes a lower barrier metal adjacent said high dielectric constant oxide insulator layer and said lower barrier metal layer being selected from the group comprising TiN and TiN/Ti layer.

2. The method of claim 1, wherein said bottom metal layer includes a barrier metal layer adjacent said high dielectric constant oxide insulator layer and said upper metal layer includes a barrier metal layer adjacent the upper oxide conductor layer, each said barrier metal layer being a metal nitride selected from the group comprising TiN and TiN/Ti.

3. The method of claim 1, wherein said bottom metal layer is from about 1000 to 4000 Å thick; said upper oxide conductor layer is from about 100 to 400 Å thick; said oxide insulator layer is from about 50 to 500 Å thick; and said upper metal layer is from about 1000 to 4000 Å thick.

4. A method of fabricating a metal-oxide semiconductor capacitor (MOS), comprising the steps of:
   providing a structure having an overlying semiconductor layer;
   depositing a high dielectric constant oxide insulator layer over said semiconductor layer; said high dielectric constant oxide insulator layer having one or more pin hole defects;
   annealing said structure in an oxidizing ambient to cause said exposed semiconductor to form an oxide of the semiconductor layer partially filling said one or more pin hole defects to repair said pin hole defects;
   depositing an upper oxide conductor layer over said high dielectric constant oxide insulator layer; and
   depositing an upper metal layer over said upper oxide conductor layer; wherein said upper metal layer includes a barrier metal layer adjacent said high dielectric constant oxide insulator layer, said barrier metal layer being a metal nitride selected from the group comprising TiN and TiN/Ti.

5. The method of claim 4, wherein said semiconductor layer is comprised of a material selected from the group consisting of polysilicon, doped polysilicon, and a polycide.

6. The method of claim 4, wherein said high dielectric constant oxide insulator layer is comprised of a material selected from the group comprising $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9(SBT)$, $(Pb, La)(Zr, Ti)O_3$, and $Bi_4Ti_3O_{12}$; said upper oxide conductor layer is comprised of a material selected from the group comprising indium tin oxide ($In_2O_3$:Sn), tin oxide ($SnO_2$), zinc oxide (ZnO), and ruthenium oxide ($RuO_2$); and said upper metal layer comprises an upper Al layer over an upper TiN layer.

7. The method of claim 4, wherein said upper oxide conductor layer from about 100 to 400 Å thick; said oxide insulator layer is from about 50 to 500 Å thick; and said upper metal layer from about 1000 to 4000 Å thick.

8. A method of fabricating a metal-oxide-metal capacitor, comprising the steps of:
   depositing a bottom metal layer;
   depositing a lower oxide conductor layer over said bottom metal layer;
   depositing a high dielectric constant oxide insulator layer over said lower oxide conductor layer; said high dielectric constant oxide insulator layer having one or more pin hole defects exposing the underlying said lower oxide conductor layer;
   etching said exposed lower oxide conductor layer to remove said lower oxide conductor layer under said one or more pin hole defects exposing the underlying said bottom metal layer;
   annealing said structure in an oxidizing ambient atmosphere to cause said exposed bottom metal layer to form a metal oxide partially filling said one or more pin hole defects to repair said pin hole defects; depositing an upper oxide conductor layer over said repaired high dielectric conductor oxide layer;
   depositing an upper metal layer over said upper oxide conductor layer to form a metal-oxide-metal capacitor.

9. The method of claim 8, wherein said bottom and upper metal layers each include a barrier metal layer adjacent said high dielectric constant oxide insulator layer, said barrier metal layer being comprised of a metal nitride layer.

10. The method of claim 8, wherein said oxide insulator layer is comprised of a material selected from the group comprising: $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9(SBT)$, $(Pb, La)(Zr, Ti)O_3$, and $Bi_4Ti_3O_{12}$; said lower and upper oxide conductor layers being comprised of a material selected from the group comprising indium tin oxide ($In_2O_3$:Sn), tin oxide ($SnO_2$), zinc oxide (ZnO), and ruthenium oxide ($RuO_2$); and said upper metal layer being comprised of an upper Al layer over an upper TiN layer, and said bottom metal layer being comprised of a lower barrier layer over a lower Al layer, said barrier layer being comprised of a material selected from the group comprising TiN or TiN/Ti layer.

11. The method of claim 8, wherein said oxide insulator layer is comprised of $Ta_2O_5$; said lower and upper oxide conductor layers are comprised of indium tin oxide; said upper metal layer comprises an upper Al layer over an upper TiN layer, and said bottom metal layer comprises a lower barrier layer over a lower Al layer, said barrier layer being comprised of a material selected from the group comprising TiN and TiN/Ti layer; and said etching of said exposed lower oxide conductor layer is selected from the group comprising: a wet HCl etch; a vapor phase HCl etch, and a dry etch.

12. The method of claim 8, wherein said bottom metal layer from about 1000 to 4000 Å thick; said lower oxide conductor layer is below about 100 Å thick; said oxide insulator layer is from about 50 to 500 Å thick; said upper oxide conductor layer is from about 100 to 400 Å thick; and said upper metal layer is from about 1000 to 4000 Å thick.

13. A method of fabricating a metal-oxide-metal capacitor, comprising the steps of:

depositing a bottom metal layer;

depositing a bottom barrier metal layer comprised of a metal nitride, over said bottom metal layer;

depositing a lower oxide conductor layer over said bottom metal nitride layer;

depositing a high dielectric constant oxide insulator layer over said lower oxide conductor layer; said high dielectric constant oxide insulator layer having one or more pin hole defects exposing the underlying said lower oxide conductor layer;

etching said exposed lower oxide conductor layer to remove said lower oxide conductor layer under said one or more pin hole defects exposing the underlying said metal nitride layer;

annealing said structure in an oxidizing ambient to cause said exposed barrier metal nitride layer to form an oxide of the barrier metal sufficient to repair said one or more pinhole defects;

depositing an upper oxide conductor layer over said repaired high dielectric conductor oxide layer;

depositing an upper barrier metal layer over said upper oxide conductor layer; said upper barrier metal layer being comprised of a metal nitride, and depositing an upper metal layer to form a metal-oxide-metal capacitor.

14. The method of claim 13, wherein said oxide insulator layer is comprised of a material selected from the group comprising: $Ta_2O_5$, $SrTiO_3$, $BaTiO_3$, $SrTiO_3$, $(Ba, Sr)TiO_3$, $Pb(Zr, Ti)O_3$, $SrBi_2Ta_2O_9$(SBT), $(Pb, La)(Zr, Ti)O_3$, and $Bi_4Ti_3O_{12}$; said lower and upper oxide conductor layers being comprised of a material selected from the group comprising: indium tin oxide ($In_2O_3$:Sn), tin oxide ($SnO_2$), zinc oxide (ZnO), and ruthenium oxide ($RuO_2$); and said bottom and upper metal layers being comprised of Al.

15. The method of claim 13, wherein said oxide insulator layer is comprised of $Ta_2O_5$; said lower and upper oxide conductor layers being comprised of indium tin oxide; said bottom and upper metal layers being comprised of Al; said bottom and upper barrier metal layers being comprised of TiN; and said etching of said exposed lower oxide conductor layer is selected from the group comprising: a wet HCl etch, a vapor phase HCl etch, and a dry etch.

* * * * *